United States Patent [19]

Lambson et al.

[11] Patent Number: 5,670,417
[45] Date of Patent: Sep. 23, 1997

[54] METHOD FOR FABRICATING SELF-ALIGNED SEMICONDUCTOR COMPONENT

[75] Inventors: Charles T. Lambson, Gilbert; Paul W. Sanders, Scottsdale, both of Ariz.

[73] Assignee: Motorola, Inc., Schaumburg, Ill.

[21] Appl. No.: 622,535

[22] Filed: Mar. 25, 1996

[51] Int. Cl.⁶ ............................................. H01L 21/225
[52] U.S. Cl. ...................... 437/162; 437/31; 437/186; 148/DIG. 10; 148/DIG. 11
[58] Field of Search ..................... 437/31, 163, 186, 437/189, 190, 191, 193, 195

[56] References Cited

U.S. PATENT DOCUMENTS

| | | | |
|---|---|---|---|
| 3,753,774 | 8/1973 | Veloric | 117/212 |
| 4,450,470 | 5/1984 | Shiba | 357/59 |
| 4,483,726 | 11/1984 | Isaac et al. | |
| 4,714,686 | 12/1987 | Sander et al. | 437/195 |
| 4,745,087 | 5/1988 | Iranmanesh | 437/69 |
| 4,778,774 | 10/1988 | Blossfeld | 437/31 |
| 4,782,030 | 11/1988 | Katsumata et al. | 437/33 |
| 4,800,177 | 1/1989 | Nakamae | 437/193 |
| 4,839,305 | 6/1989 | Brighton | |
| 4,966,865 | 10/1990 | Welch et al. | 437/31 |
| 5,013,677 | 5/1991 | Hozumi | 437/31 |
| 5,100,812 | 3/1992 | Yamada et al. | 437/31 |
| 5,244,835 | 9/1993 | Hachiya | 437/186 |
| 5,283,203 | 2/1994 | Gill et al. | 437/34 |
| 5,420,050 | 5/1995 | Jerome et al. | 437/31 |
| 5,420,053 | 5/1995 | Miyazaki | 437/31 |

*Primary Examiner*—John Niebling
*Assistant Examiner*—Long Pham
*Attorney, Agent, or Firm*—George C. Chen

[57] ABSTRACT

A self-aligned semiconductor component (10) includes a layer (14) having two openings (36, 38) and overlying a doped region (13) in a substrate (11). One (36) of the two openings (36, 38) is used to self-align a different doped region (22) and a portion (27) of an electrode (27, 31). The electrode (27, 31) has another portion (31) overlying the self-aligned portion (27) to increase the current carrying capacity of the electrode (27, 31). A different electrode is formed in the other one (38) of the two openings (36, 38) and has a smaller current carrying capacity than the other electrode (27, 31).

19 Claims, 4 Drawing Sheets

METHOD FOR FABRICATING SELF-ALIGNED SEMICONDUCTOR COMPONENT

BACKGROUND OF THE INVENTION

This invention relates, in general, to semiconductors, and more particularly, to a self-aligned semiconductor component.

Lithography limitations often determine the minimum sizes of semiconductor components. For example, a photolithography method can repeatably align a pattern in a first layer to within approximately 0.2 microns of a pattern in an underlying layer. Therefore, to ensure a manufacturable process, the pattern in the first layer is typically designed to overlap the pattern in the underlying layer by at least approximately 0.2 microns per side. Similarly, a pattern in a second layer is typically designed to overlap the pattern in the first layer by at least approximately 0.2 microns per side.

Thus, a first semiconductor component that uses more photolithography steps than a second semiconductor component will be larger than the second semiconductor component. Additionally, the first semiconductor component will also have a lower manufacturing yield than the second semiconductor component because the greater number of processing steps required for the first semiconductor component increases the probability of manufacturing error.

Accordingly, a need exists for a semiconductor component that is small in size, that is fabricated using a manufacturable process having a minimum number of lithography steps, and that has high a manufacturing yield.

DETAILED DESCRIPTION OF THE DRAWINGS

Turning to the figures for a more detailed description, FIGS. 1, 2, 3, 4, 5, and 6 illustrate partial cross-sectional views of an embodiment of a self-aligned semiconductor component 10 during fabrication. Semiconductor component 10 is manufactured in and over a substrate 11, which is comprised of a semiconductor material including, but not limited to silicon or gallium arsenide. If comprised of silicon, substrate 11 has a first conductivity type such as, for example, an n-type conductivity.

Figure 1:
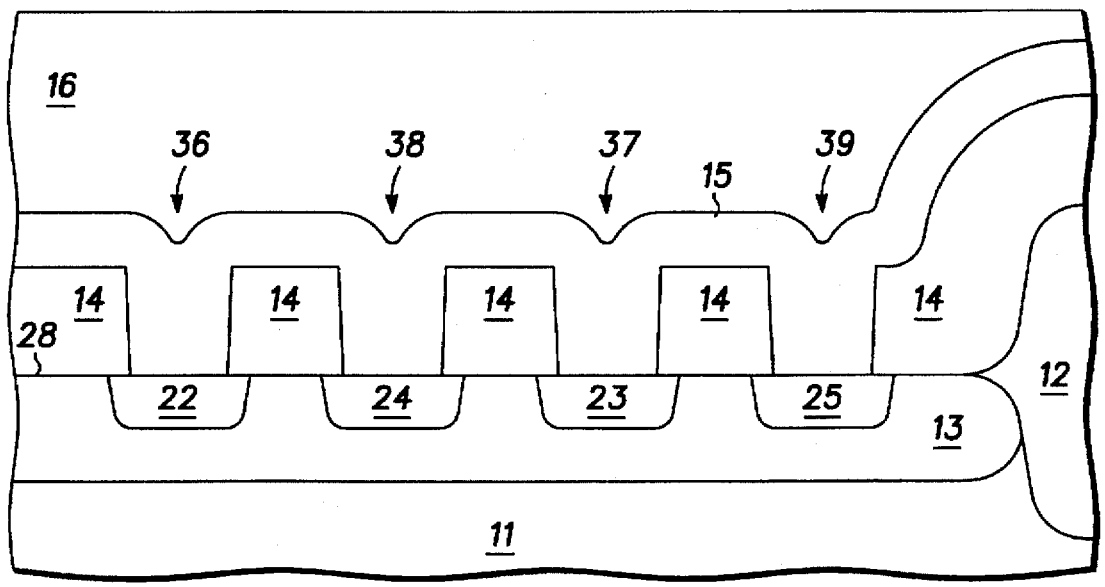
FIGS. 1, 2, 3, 4, 5, and 6 illustrate partial cross-sectional views of an embodiment of a self-aligned semiconductor component during fabrication in accordance with the present invention.

FIG. 1 illustrates an isolation feature 12 formed in a surface 28 of substrate 11 to electrically isolate semiconductor component 10 from other semiconductor components (not shown) in substrate 11. Isolation feature 12 can be formed using an oxidation technique such as, for example, a local oxidation of silicon (LOCOS) process. However, isolation feature 12 can also be formed using a trench refill technique, an oxygen implant technique, or the like.

Then, a doped region 13 is formed in substrate 11 using diffusion or ion implantation techniques. Doped region 13 can be self-aligned to isolation feature 12 as known in the art. Doped region 13 has a second conductivity type that is different from the first conductivity type of substrate 11. Thus, when the first conductivity type is n-type, then the second conductivity type is p-type.

Next, a layer 14 is provided or deposited over surface 28 of substrate 11. Layer 14 serves as a master layer to which different portions of semiconductor component 10 are self-aligned. Layer 14 can also serve as an electrical isolator between substrate 11 and subsequently deposited metal layers. Thus, layer 14 is preferably comprised of a dielectric material such as, for example, oxide or nitride and can be deposited to a thickness of approximately 0.4–1.0 microns using a chemical vapor deposition (CVD) technique.

Vias or openings 36, 37, 38, and 39 are formed in layer 14 to expose different portions of substrate 11. Openings 36 and 37 are used to self-align doped emitter regions and emitter electrodes of a bipolar transistor, and openings 38 and 39 are used to self-align doped base regions and base electrodes of the bipolar transistor, as described hereinafter. Accordingly, openings 36 and 37 represent a plurality of openings that are interdigitated between a different plurality of openings represented by openings 38 and 39.

Openings 36, 37, 38, and 39 are preferably etched into layer 14 by using an etch mask (not shown) and an isotropic etchant to provide sloped sidewalls for openings 36, 37, 38, and 39. The sloped sidewalls improve the conformality of a layer subsequently deposited into openings 36, 37, 38, and 39. If conformality of the subsequently deposited layer is easily obtained, then an anisotropic etchant can be used to provide substantially vertical sidewalls for openings 36, 37, 38, and 39. Openings 36, 37, 38, and 39 preferably have an aspect ratio greater than approximately 1.0 to ensure the manufacturability of semiconductor component 10. Therefore, if layer 14 has a thickness of approximately 0.75 microns, then openings 36, 37, 38, and 39 have a width preferably less than approximately 0.75 microns.

A silicon layer 15 is deposited over layer 14 and into openings 36, 37, 38, and 39. Silicon layer 15 preferably has a thickness greater than the thickness of layer 14 to ensure that openings 36, 37, 38, and 39 are completely filled by silicon layer 15. As an example, silicon layer 15 is comprised of polysilicon and is deposited using a CVD technique.

Figure 2:
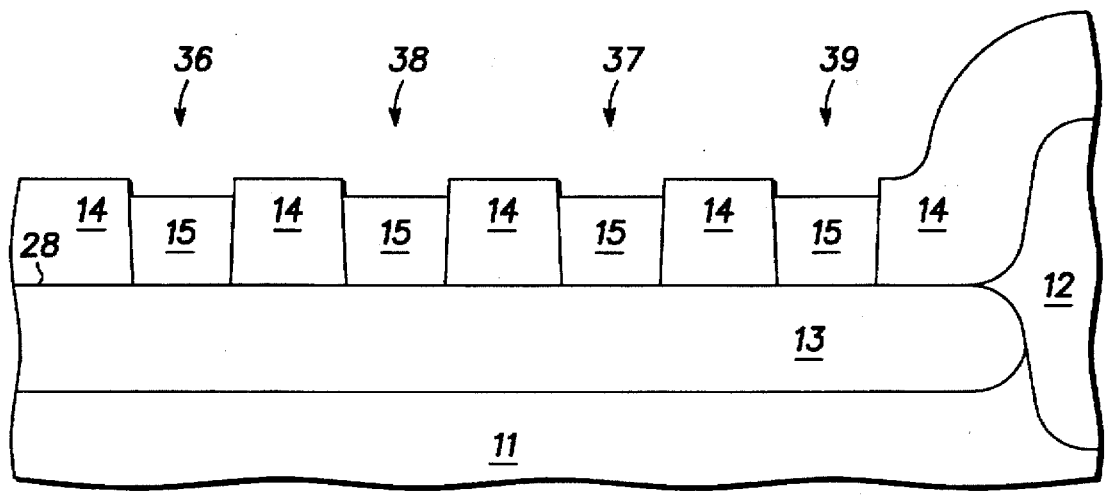

Silicon layer 15 is planarized using a chemical-mechanical polish or an etchback process. In the etchback process of FIG. 1, a sacrificial layer 16 is coated over silicon layer 15 to produce a planar surface. Sacrificial layer 16 can be comprised of photoresist, spin-on-glass, or the like. Then, sacrificial layer 16 and silicon layer 15 are simultaneously etched at substantially the same etch rate. If sacrificial layer 16 is comprised of photoresist, then a mixture of carbon tetrafluoride and oxygen can be used to simultaneously etch sacrificial layer 16 and silicon layer 15. Regardless of the specific etchback chemistry used, the isotropic etchant should not significantly etch layer 14 relative to sacrificial layer 16 and silicon layer 15. In the etchback process, silicon layer 15 is preferably overetched so that silicon layer 15 is recessed within openings 36, 37, 38, and 39, as depicted in FIG. 2.

Figure 3:
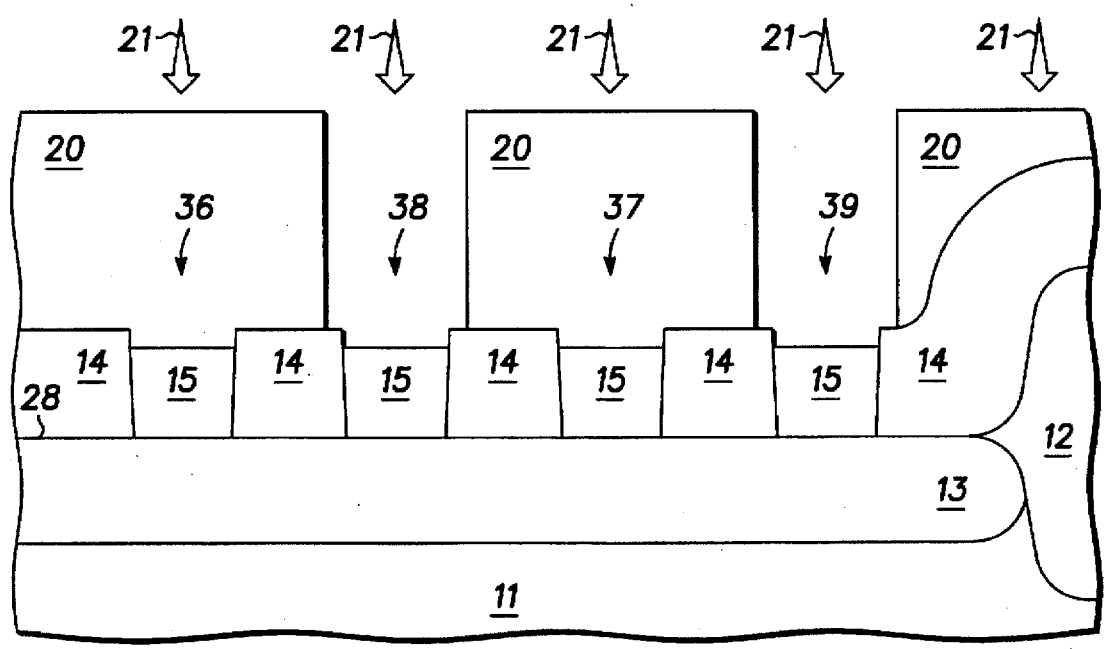

Continuing with FIG. 3, an implant mask 20 is patterned overlying silicon layer 15 and layer 14 to expose portions of silicon layer 15 located in openings 38 and 39. It is understood that the same reference numerals are used in the figures to denote the same elements. An implant 21 is used to dope the exposed portions of silicon layer 15 with a dopant of the second conductivity type. Accordingly, silicon layer 15 in openings 38 and 39 are transformed into a doped silicon layer. Implant mask 20 is used to prevent silicon layer 15 in openings 36 and 37 from being doped or implanted with the dopant of the second conductivity type. If the second conductivity type is p-type, the dopant of the second conductivity type can be boron or the like. As an example, implant mask 20 can be comprised of photoresist or silicon nitride.

Then, implant mask 20 is removed and a different implant mask (not shown) is patterned over silicon layer 15 and layer 14 to expose portions of silicon layer 15 located in openings 36 an 37. A different implant is used to dope the exposed portions of silicon layer 15 with a dopant of the first conductivity type. The different implant mask is used to prevent silicon layer 15 in openings 38 and 39 from being doped or implanted with the dopant of the first conductivity type. As an example, if the first conductivity type is n-type, the dopant of the first conductivity type can be arsenic or the like.

Figure 4:
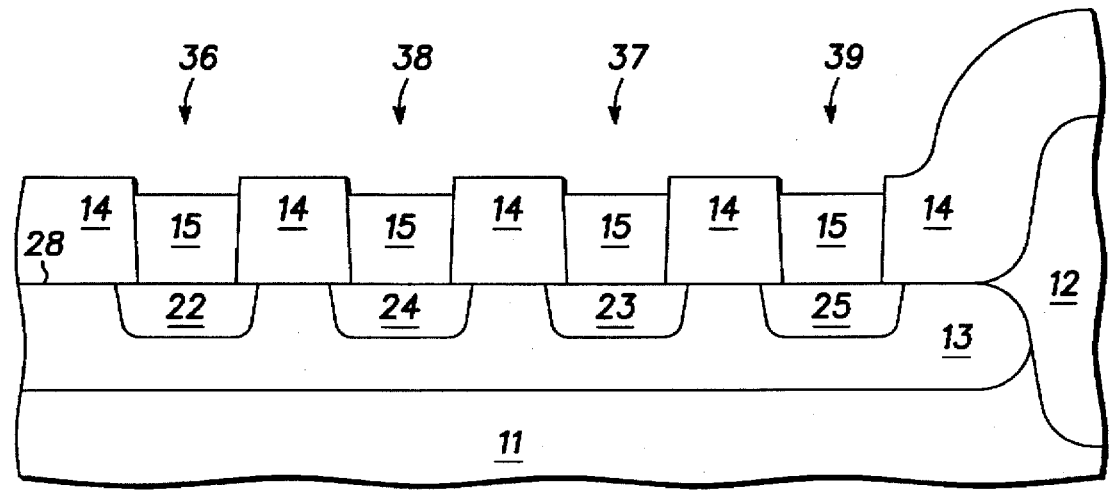

As illustrated in FIG. 4, after the different implant mask is removed, the dopants in silicon layer 15 are heated or annealed to a temperature of greater than approximately 700 degrees Celsius (°C.) in order to diffuse the dopants out of silicon layer 15 and into different portions of substrate 11. As illustrated in FIG. 4, the dopants in silicon layer 15 of openings 36, 37, 38, and 39 are used to form doped regions 22, 23, 24, and 25, respectively, in substrate 11. Doped regions 22, 23, 24, and 25 are self-aligned to openings 36, 37, 38, and 39, respectively. A separate diffusion mask or patterned photoresist layer is not required for forming self-aligned, doped regions 22, 23, 24, and 25, which improves the manufacturing yield of semiconductor component 10.

As an example, doped regions 22 and 23 can represent emitter regions of the first conductivity type while doped regions 13, 24 and 25 can represent a base region of the second conductivity type in a bipolar transistor. Doped regions 24 and 25 are more heavily doped compared to doped region 13 to provide low contact resistance between a subsequently formed electrical contact and doped regions 24 and 25.

In a different process, doped regions 22, 23, 24, and 25 can be formed by implanting dopants directly into substrate 11 using implant masks, layer 14, and openings 36, 37, 38, and 39 as a self-aligned implant mask. After this alternative implant process, silicon layer 15 or a metal layer is deposited into openings 36, 37, 38, and 39 and is subsequently planarized.

Figure 5:
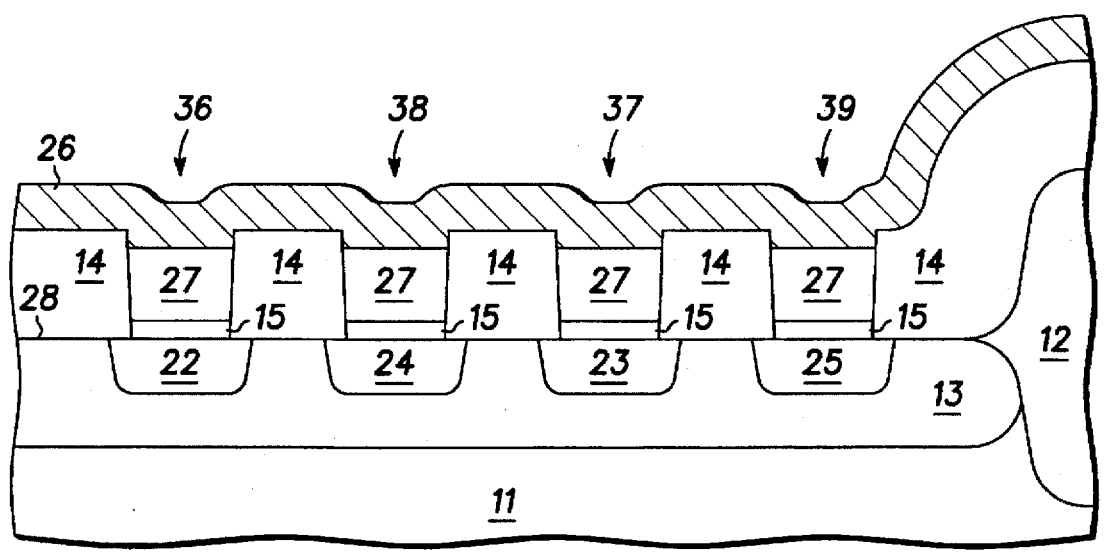

Referring now to FIG. 5, portions of silicon layer 15 are converted into a silicide 27 to provide lower electrical resistance. Silicide 27 forms electrical contacts or electrodes located in and self-aligned to openings 36, 37, 38, and 39. A separate etch mask or patterned photoresist layer is not required to form the self-aligned electrical contacts, which improves the manufacturing yield of semiconductor component 10.

To form silicide 27, a metal layer 26 is deposited over layer 14 and silicon layer 15 by using a sputtering, evaporating, or plating technique known in the art. Metal layer 26 can be approximately the same thickness as silicide 27. Metal layer 26 is preferably comprised of platinum to provide adequate etch selectivity for a subsequent etch process as described hereinafter. However, other metals such as, for example, titanium or the like can also be used for metal layer 26.

Silicon layer 15 and metal layer 26 are heated or annealed to a temperature of greater than approximately 400 degrees Celsius. Portions of metal layer 26 that contact silicon layer 15 will react with silicon layer 15 to form silicide 27 at the elevated temperature. To prevent metallic contamination of substrate 11, the silicide formation process preferably does not consume all of silicon layer 15. Instead, approximately 200–600 angstroms (Å) of silicon layer 15 preferably remains in openings 36, 37, 38, and 39 between silicide 27 and substrate 11 as portrayed in FIG. 5.

Figure 6:
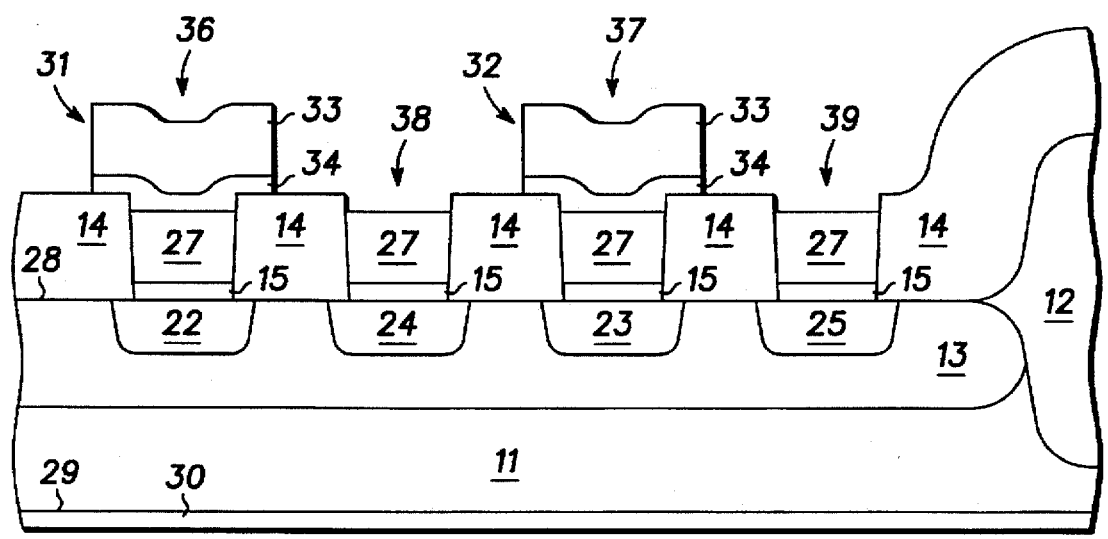

Turning to FIG. 6, after removing the unreacted portions of metal layer 26, metal lines 31 and 32 are formed over openings 36 and 37. Metal lines 31 and 32 are electrically coupled to and directly contact underlying silicide 27 in openings 36 and 37. Metal lines 31 and 32 are comprised of a conductive layer 33 overlying an optional barrier layer 34. Conductive layer 33 is comprised of an electrically conductive material including, but not limited to, gold or aluminum. Barrier layer 34 is comprised of an electrically conductive material including, but not limited to, titanium tungsten that serves as a diffusion barrier to prevent silicide 27 from being contaminated by conductive layer 33.

To form metal lines 31 and 32, barrier layer 34 is deposited over silicide 27, and conductive layer 33 is deposited over barrier layer 34. Barrier layer 34 and conductive layer 33 are deposited using sputtering, evaporating, or plating techniques known in the art. An etch mask (not shown) is used with an etchant to pattern metal lines 31 and 32. As an example, if conductive layer 33 were comprised of approximately 4,000–10,000 Å of gold and if barrier layer 34 were comprised of approximately 1,000–4,000 Å of titanium tungsten, an Argon ion milling process and a fluorine and chlorine based dry etchant can be used to etch conductive layer 33 and barrier layer 34, respectively. Regardless of the specific etchants used to form metal lines 31 and 32, the etchants should not significantly etch silicide 27 or layer 14 compared to conductive layer 33 and barrier layer 34.

Afterwards, substrate 11 can be thinned, and a backside contact 30 can be formed over a surface 29 of substrate 11. Backside contact 30 can be used as an electrical contact or electrode for semiconductor component 10 and can be comprised of nickel vanadium or the like.

When semiconductor component 10 is a bipolar transistor, backside contact 30 can represent a collector electrode. In this bipolar transistor embodiment, opening 36 serves to self-align an emitter region, which is comprised of doped region 22, and a portion of an emitter contact or electrode, which is comprised of silicide 27 in opening 36. Similarly, opening 37 self-aligns a different emitter region, which is comprised of doped region 23, and a portion of a different emitter contact, which is comprised of silicide 27 in opening 37. Also, opening 38 self-aligns a base region, which is comprised of doped region 24, and a base contact or electrode, which is comprised of silicide 27 in opening 38. Furthermore, opening 39 self-aligns a different base region, which is comprised of doped region 25, and a different base contact, which is comprised of silicide 27 in opening 39. As illustrated in FIG. 6, the base regions and contacts are interdigitated between the emitter regions and contacts, respectively.

Metal lines 31 and 32 are less resistive and can have a higher current carrying density compared to silicide 27. Metal lines 31 and 32 are used with silicide 27 in openings 36 and 37 to facilitate the conduction of a high density emitter current. Silicide 27 in openings 38 and 39 represent base electrodes, which do not require a high current carrying capacity. As known in the art, base currents are much smaller than emitter currents due to the large forward gain of a bipolar transistor. Therefore, silicide 27 in portions of openings 38 and 39 overlying doped region 13 do not need an overlying metal layer for carrying a higher current density.

Figure 7:
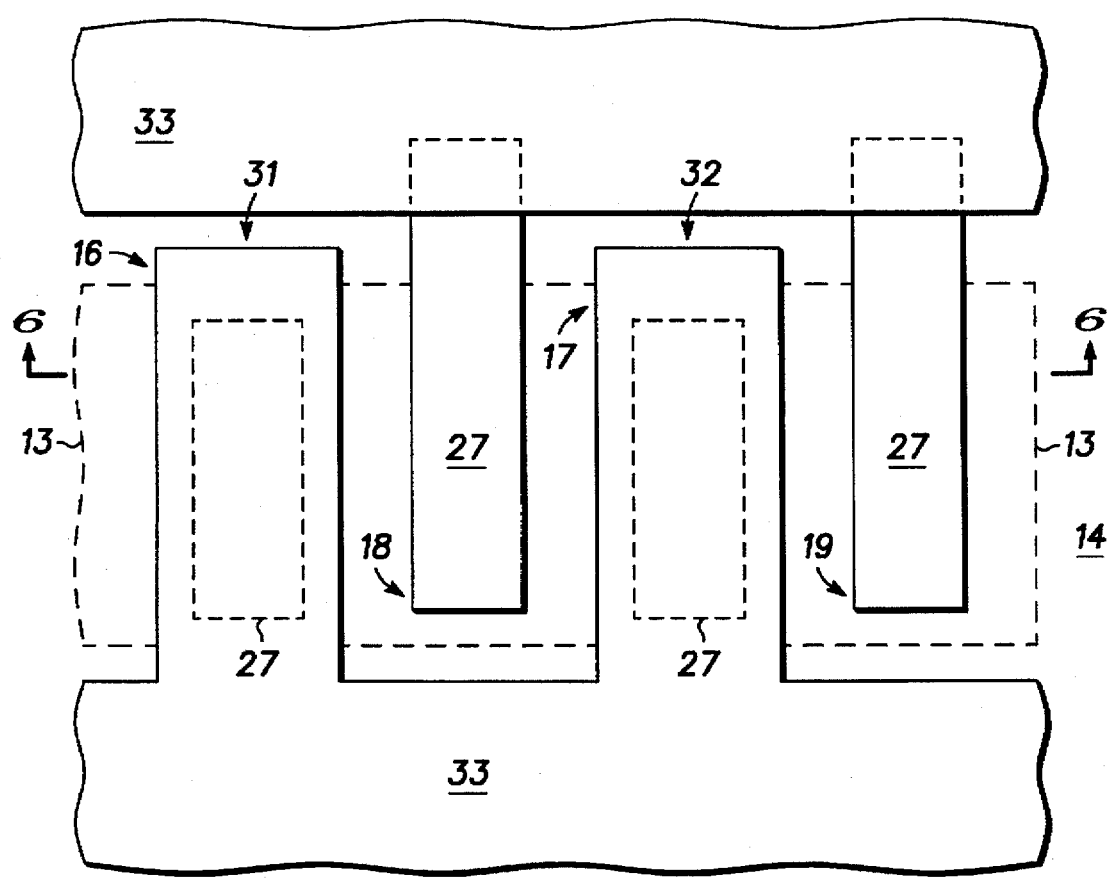
FIG. 7 portrays a partial top view of an embodiment of the semiconductor component in FIG. 6 in accordance with the present invention.

Turning to FIG. 7, a partial top view of an embodiment of semiconductor component 10 in FIG. 6 is depicted. Silicide 27 in openings 36 and 37 is located underneath conductive layer 33 and is represented by dashed lines. Similarly, doped region 13 is located underneath layer 14 and is also represented by dashed lines. Metal lines 31 and 32 are electrically coupled together, which couples together silicide 27 in openings 36 and 37. Similarly, silicide 27 in openings 38 and 39 are coupled together by a portion of conductive layer 33 located outside doped region 13.

As portrayed in FIGS. 6 and 7, silicide 27 in portions of openings 38 and 39 that overlie doped region 13 remain substantially free from or are substantially devoid of direct contact with a different metal layer. By not having metal lines overlying openings 38 and 39, the size of semiconductor component 10 is not limited by the lithography resolution between adjacent metal lines 31 and 32 and is also not limited by the alignment tolerance between the pattern of metal lines 31 and 32 and the pattern of silicide 27.

Accordingly, openings 36, 37, 38, and 39 can be located closer to each other compared to the prior art, and the size of semiconductor component 10 can be smaller than the prior art. A smaller semiconductor component 10 increases of number of die per substrate, which lowers the cost of manufacturing a single semiconductor component 10.

With smaller spacings between openings 36, 37, 38, and 39, the parasitic resistance of doped region 13 can be reduced and a greater number of doped regions 22, 23, 24, and 25 can be located within doped region 13. Thus, when semiconductor component 10 is a bipolar transistor, semiconductor component 10 has a smaller base resistance, smaller junction capacitances, and a greater number of emitter regions, which improves the power gain and frequency response of semiconductor component 10.

Therefore, in accordance with the present invention, it is apparent there has been provided an improved self-aligned semiconductor component and method of fabrication that overcomes the disadvantages of the prior art. The manufacturing yield of a semiconductor component is improved because of the elimination of extra etch and diffusion masks. The semiconductor component is cost effective because the smaller size of the semiconductor component increases the number of die per wafer. The size of the semiconductor component is not limited by lithography alignment limitations between adjacent layers and is also less limited by lithography resolution limitations between adjacent structures in a single layer.

While the invention has been particularly shown and described with reference to preferred embodiments, it will be understood by those skilled in the art that changes in form and detail may be made without departing from the spirit and scope of the invention. For instance, semiconductor component 10 can represent a field effect transistor, wherein gate electrodes that do not require high current densities reside in openings 38 and 39. Accordingly, the disclosure of the present invention is not intended to be limiting. Instead, the disclosure of the present invention is intended to be illustrative of the scope of the invention, which is set forth in the following claims.

We claim:

1. A method of fabricating a self-aligned semiconductor component comprising the steps of:

providing a substrate having a first doped region;

forming a layer overlying the substrate, the layer having a first opening and a second opening, a portion of the second opening overlying a portion of the first doped region;

using the first opening to form a second doped region self-aligned to the first opening;

using the first opening to form a first electrical contact coupled to the second doped region, the first electrical contact self-aligned to the first opening;

forming a second electrical contact in the second opening; and forming a metal line overlying and contacting the second electrical contact, wherein the first electrical contact in the first opening is substantially free of direct contact with a metal layer overlying the first opening.

2. The method according to claim 1 wherein the step of providing the substrate includes providing a semiconductor material for the substrate, wherein the step of forming the layer includes providing a dielectric material for the layer, wherein the step of using the first opening to form the first electrical contact includes providing a silicide for the first electrical contact, and wherein the step of forming the second electrical contact includes self-aligning the second electrical contact to the second opening.

3. The method according to claim 1 wherein the step of forming the layer includes providing a plurality of first openings and a plurality of second openings located in the layer, the plurality of first openings interdigitated between the plurality of second openings, a portion of each of the plurality of second openings overlying different portions of the first doped region, wherein the step of using the first opening to form the first electrical contact includes forming a plurality of first electrical contacts self-aligned to and located in the plurality of first openings, wherein the step of forming the second electrical contact includes forming a plurality of second electrical contacts self-aligned to and located in the plurality of second openings, wherein the step of forming the metal line includes forming a plurality of metal lines, each of the plurality of metal lines overlying the plurality of second openings and contacting a different one of the plurality of second electrical contacts in the plurality of second openings, and wherein the plurality of first electrical contacts in the plurality of first openings are substantially free of direct contact with a metal layer overlying the plurality of first openings.

4. The method according to claim 3 further comprising the step of forming a bipolar transistor, wherein the plurality of second electrical contacts and the plurality of metal lines form a plurality of emitter fingers for the bipolar transistor and wherein the plurality of first electrical contacts form a plurality of base fingers for the bipolar transistor.

5. The method according to claim 1 wherein the step of using the first opening to form the first electrical contact comprises the steps of:

depositing silicon in the first opening;

doping the silicon in the first opening with a dopant;

depositing a metal layer overlying the silicon;

heating the metal layer, wherein a first portion of the metal layer reacts with the silicon to form a silicide in the first opening; and removing a second portion of the metal layer.

6. The method according to claim 5 wherein the step of depositing the metal layer includes providing platinum for the metal layer.

7. The method according to claim 5 wherein the step of using the first opening to form the first electrical contact further includes keeping a portion of the silicon between the silicide and the substrate after the step of heating the metal layer.

8. The method according to claim 5 wherein the step of forming the second electrical contact comprises the steps of:

depositing the silicon in the second opening;

doping the silicon in the second opening with a different dopant;

heating the different dopant to dope a third doped region with the different dopant, the third doped region located in the first doped region and self-aligned to the second opening; and using the silicon in the second opening to form the silicide in the second opening and electrically coupled to the third doped region, wherein the step of using the first opening to form the second doped region comprises the step of heating the dopant to form the second doped region with the dopant.

9. The method according to claim 8 wherein the step of doping the silicon in the first opening includes implanting the dopant into the silicon in the first opening, the dopant having a first conductivity type, wherein the step of doping the silicon in the second opening includes implanting the different dopant into the silicon in the second opening, the different dopant having a second conductivity type different from the first conductivity type, and wherein the step of providing the substrate includes providing the first conductivity type for the first doped region.

10. A method of fabricating a semiconductor component comprising the steps of:

providing a substrate;

depositing a layer overlying the substrate;

etching a first opening and a second opening in the layer;

depositing a polysilicon layer in the first and second openings;

doping the polysilicon layer in the second opening with a first dopant to form a doped polysilicon layer in the second opening;

diffusing the first dopant out of the doped polysilicon layer;

forming a first electrode self-aligned to the first opening;

forming a first portion of a second electrode self-aligned to the second opening; and forming a second portion of the second electrode overlying the first portion of the second electrode.

11. The method according to claim 10 wherein the step of etching the first opening and the second opening comprises the steps of:

exposing a first portion of the substrate with the first opening; and exposing a second portion of the substrate with the second opening, wherein the step of doping the polysilicon layer includes implanting the first dopant into the polysilicon layer in the second opening and using a first implant mask to keep the first dopant out of the polysilicon layer in the first opening, and wherein the step of diffusing the first dopant includes diffusing the first dopant from the doped polysilicon layer into the second portion of the substrate to create a first doped region self-aligned to the second opening.

12. The method according to claim 11 further comprising the steps of:

implanting a second dopant into the polysilicon layer in the first opening;

keeping the doped polysilicon layer in the second opening substantially devoid of the second dopant; and diffusing the second dopant into the first portion of the substrate to form a second doped region self-aligned to the first opening.

13. The method according to claim 10 wherein the step of diffusing the first dopant includes diffusing the first dopant from the doped polysilicon layer into the substrate and wherein the step of forming the first electrode comprises the steps of:

using the polysilicon layer in the first opening to form a first silicide in the first opening; and keeping a portion of the polysilicon layer in the first opening between the substrate and the first silicide, wherein the step of forming the first portion of the second electrode comprises the steps of:

using the doped polysilicon layer in the second opening to form a second silicide in the second opening; and keeping a portion of the doped polysilicon layer in the second opening between the substrate and the second silicide.

14. The method according to claim 10 further comprising the step of forming a doped region in the substrate before the step of depositing the layer, wherein the step of etching the first opening and the second opening includes etching a portion of the first opening overlying the doped region and wherein the first electrode in the portion of the first opening remains substantially devoid of direct contact with another metal layer overlying the first opening.

15. The method according to claim 10 further comprising the step of planarizing the polysilicon layer.

16. A method of manufacturing a semiconductor component comprising:

providing a substrate having a first doped region of a first conductivity type;

forming an electrically insulating layer overlying the substrate, the electrically insulating layer having a first opening and a second opening, the first and second openings overlying the first doped region;

forming a second doped region in the substrate and self-aligned to the first opening; and forming a first electrical contact coupled to the second doped region, located in the first opening, and self-aligned to the first opening.

17. The method of claim 16 wherein the step of forming the second doped region includes forming the second doped region in the first doped region wherein the second doped region has a second conductivity type different from the first conductivity type.

18. The method of claim 17 wherein the step of forming the second doped region includes forming a doped silicon layer in the first opening and diffusing the second doped region into the substrate from the doped silicon layer and wherein the step of forming the first electrical contact includes forming a silicide in the first opening.

19. The method of claim 18 further comprising keeping the electrically insulating layer overlying the substrate after the step of forming the first electrical contact.

* * * * *